United States Patent [19]

Afromowitz

[11] Patent Number: 4,730,109

[45] Date of Patent: Mar. 8, 1988

[54] APPARATUS AND METHOD FOR MEASURING ELECTRIC FIELD BY ELECTROREFLECTANCE

[75] Inventor: Martin A. Afromowitz, Seattle, Wash.

[73] Assignee: Puget Sound Power & Light Company, Bellevue, Wash.

[21] Appl. No.: 880,306

[22] Filed: Jun. 30, 1986

[51] Int. Cl.[4] .............................................. G01J 3/50
[52] U.S. Cl. ............................... 250/226; 250/231 R; 324/96
[58] Field of Search ................... 250/340, 341, 231 R, 250/226; 356/445, 446, 447, 448; 324/96

[56] References Cited

U.S. PATENT DOCUMENTS

| | | | |
|---|---|---|---|
| 4,142,802 | 3/1979 | Pollak et al. ...................... | 356/445 |
| 4,446,719 | 5/1984 | Lambert ............................ | 250/341 |
| 4,678,904 | 7/1987 | Saaski et al. ..................... | 250/227 |

OTHER PUBLICATIONS

S. Nonomura, H. Okamoto, T. Nishino and Y. Hamakawa, "Electroreflectance Study of Electronic Structure in a-Si:H", Journal de Physique, Colloque C4, Supplement au numero 10, Tome 42, Oct. 1981, pp. C4-761-C4-764.

S. Nonomura, H. Okamoto and Y. Hamakawa, "Determination of the Built-in Potential in a-Si Solar Cells by Means of Electroabsorption Method", Japanese Journal of Applied Physics, vol. 21, No. 8, Aug. 1982, pp. L464-L466.

S. Nonomura, H. Okamoto, and Y. Hamakawa, "A Study of Built-in Potential in a-Si Solar Cells by Means of Back-Surface Reflected Electroabsorption", Applied Physics A: Solids and Surfaces, vol. 32, 1983, pp. 31-38.

Y. Hamakawa, "Electroreflectance and Electroabsorption", chapter 5 of vol. 21 (Hydrogenated Amorphous Silicon), Semiconductors and Semimetals, J. I. Pankove, editor, 1984, pp. 141-158.

*Primary Examiner*—David C. Nelms
*Attorney, Agent, or Firm*—Christensen, O'Connor, Johnson & Kindness

[57] ABSTRACT

Apparatus and method for measuring an electric field using the electroreflectance effect. The apparatus comprises sensor means and a probe positionable at the point at which the electric field is to be measured. The probe comprises a layer of en electroreflective material having first and second surfaces. An optical source signal is directed onto the probe such that reflection or transmission at the first and second surfaces produces an optical output signal. The intensity of the output signal provides a measure of the electroreflective effect and therefore a measure of the electric field. The wavelength of the source signal is selected such that the electroreflective material exhibits the electroreflective effect at that wavelength, and such that the reflectance of the layer of electroreflective material at that wavelength changes as the index of refraction of the electroreflective material changes.

21 Claims, 10 Drawing Figures

APPARATUS AND METHOD FOR MEASURING ELECTRIC FIELD BY ELECTROREFLECTANCE

FIELD OF THE INVENTION

The present invention is directed to an apparatus and method for measuring the strength of an electric field using an electroreflective material.

BACKGROUND OF THE INVENTION

The electroreflectance (ER) effect has been known for many years, and occurs in many materials. The ER effect describes the fact that the optical reflectivity of a material changes when a strong electric field is applied to the material. For each such material, there are specific wavelengths of light, or ranges of wavelengths, at which the ER effect exists.

An electric field may be applied to an electroreflective material by a variety of techniques. As illustrated in FIG. 1, electrodes 12 and 14 may be attached to electroreflective material 16 and to a voltage source, such that an electric field designated by electric field line 18 is produced in material 16. The area 20 between the electrodes is then illuminated with a collimated and monochromatic light beam 22, and the intensity of the reflected signal may be measured by a suitable photodetector. Variations in the intensity of the reflected signal that are correlated to voltage variations between electrodes 12 and 14 provide a measure of the ER effect. In this arrangement, the electric field is parallel to the reflecting surface at area 20. In general, the ER effect is observed for all orientations of the electric field with respect to the direction of propagation and the polarization of the incident light. The term "light" is used herein in a conventional sense to include infrared, visible and ultraviolet radiation, and the term "optical" is used to refer to such light.

FIG. 2 illustrates an alternate technique in which electroreflective material 30 is sandwiched between front electrode 32 and back electrode 34. Front electrode 32 is at least partially transparent. When a potential is applied between electrodes 32 and 34, an electric field designated by electric field line 36 is created in electroreflective material 30. Light beam 40 is directed onto transparent front electrode 32, and passes through the front electrode and onto surface 38 of electroreflective material 30, where a portion of the light is reflected. Variations of this arrangement include those in which a transparent insulator is placed between front electrode 32 and electroreflective material 30, and those in which front electrode 32 is replaced by an electrolyte, such as weak solution of potassium chloride in water. In any of these arrangements, one can observe that light in the appropriate wavelength ranges for which the ER effect occurs and, upon reflection from the electroreflective material, is no longer of constant intensity, but rather includes a small component whose magnitude depends on the magnitude of the applied electric field.

Unfortunately, the dependence of the reflectivity on electric field for known electroreflective materials is very small. Even for a high electric field on the order of 50,000 volts/cm. one is likely to see a change in reflectivity of only one part in several hundred, or perhaps even less. For this reason, the ER effect has not been exploited for the measurement of electric field strength.

SUMMARY OF THE INVENTION

The present invention provides an apparatus and method for measuring an electric field using the ER effect. The invention is based upon an amplification of the ER effect that results from utilizing an electroreflective material in a thin layer.

The electric field measuring device of the present invention comprises sensor means and a probe positionable at a point at which the electric field is to be measured. The probe comprises a layer of an electroreflective material, the layer including first and second surfaces and having a substantially uniform thickness. The sensor means includes source means for generating an optical source signal at a selected wavelength, and means for directing the source signal onto the probe, such that the first and second surfaces produce an optical output signal by reflection or transmission of the source signal. The sensor means also includes detector means for determining the intensity of the output signal. The wavelength of the source signal is selected such that the electroreflective material exhibits the ER effect at the selected wavelength, and such that the reflectance of the layer of electroreflective material at the selected wavelength changes as the index of refraction of the electroreflective material changes.

In one preferred embodiment, the probe comprises a corner cube reflector having three perpendicular, planar faces, the layer of electroreflective material being deposited on at least one and preferably all of such faces. A collimated source signal is directed to and from the probe, for example using a telescope. In a second preferred embodiment, the sensor means comprises fiber optic means having the probe positioned at one end thereof. For both preferred embodiments, suitable thicknesses for the layer of electroreflective material are in the range of 0.2 through 5 microns, and preferred wavelengths for the source signal are in the range of 200–2,000 nanometers. A suitable electroreflective material is hydrogenated amorphous silicon.

DETAILED DESCRIPTION OF THE INVENTION

The present invention provides a practical technique for using the ER effect to measure electric field strength. The measurement of an electric field according to the present invention contemplates that the electroreflective material is deposited on a substrate in a thin layer of uniform thickness, and that the reflectance or transmittance of the thin layer is then measured at a selected wavelength as an electric field is applied to the material. By using a thin layer of electroreflective material in conjunction with a selected wavelength, the result is that the ER effect is greatly amplified, to the point where it provides a practical means for measuring electric field strength. It will be appreciated throughout this discussion that because the sum of reflectivity and transmissivity is equal to unity, the ER effect can in general be monitored by measuring either the reflectance or transmittance of the thin layer.

Figure 1:
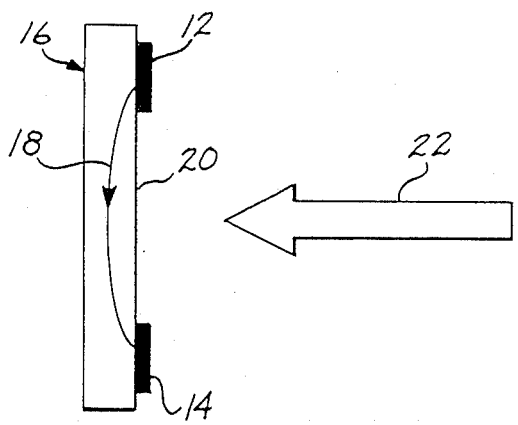
FIG. 1 is a schematic view of an arrangement for measuring the ER effect with the incident light propagating normal to the applied electric field.
Figure 2:
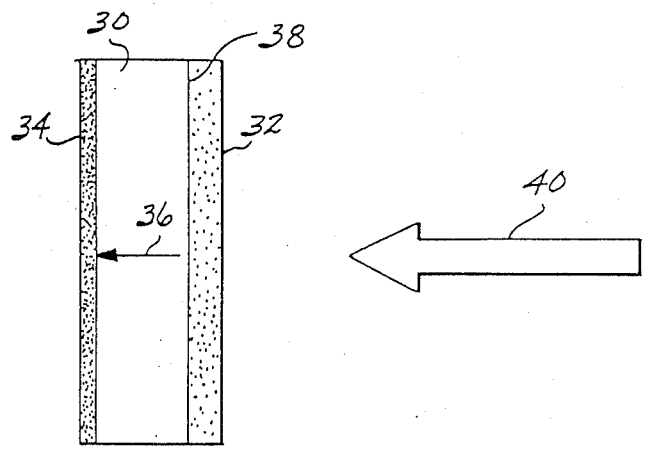
FIG. 2 is a schematic view of an arrangement for measuring the ER effect with the incident light propagating parallel to the applied electric field.
Figure 3:
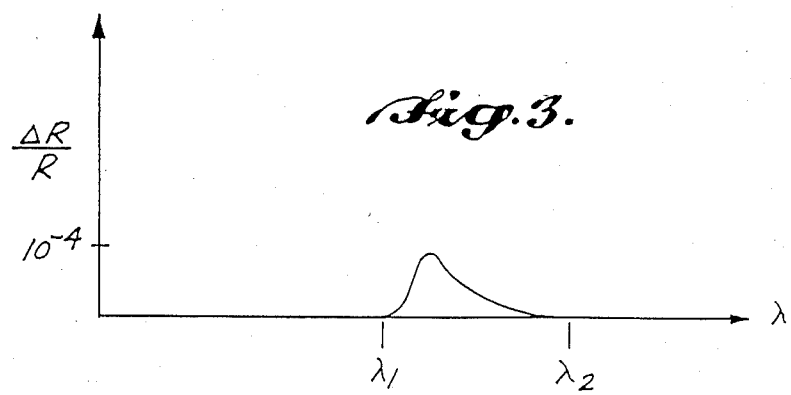
FIG. 3 is a graph showing the magnitude of the electroreflective effect as a function of wavelength for a typical electroreflective material.

FIG. 3 illustrates the ER effect for a typical electroreflective material. In FIG. 3, the fractional change in reflectance R, $\Delta R/R$, is shown as a function of wavelength $\lambda$ for a particular electric field strength. At most wavelengths, $\Delta R/R$ is zero, and no change in reflectance is caused by application of an electric field. However, within a certain wavelength range from $\lambda_1$ to $\lambda_2$, a change in reflectance is observed in response to an applied electric field in the electroreflective material. For a typical substance, the maximum fractional change in reflectance is on the order of $10^{-4}$ for an electric field on the order of 50,000 volts/cm. Depending on the particular electroreflective material used, the graph of the fractional reflectance change versus wavelength may show a single peak, such as in FIG. 3, or a plurality of adjacent peaks that typically alternate between positive and negative reflectance changes. For a semiconductor material, a range of wavelengths $\lambda_1$ to $\lambda_2$ commonly occurs near the wavelength corresponding to a photon energy close to the band gap energy for that semiconductor. Other such ranges can occur, typically at higher energies, corresponding to higher energy transitions in the semiconductor.

Figure 4:
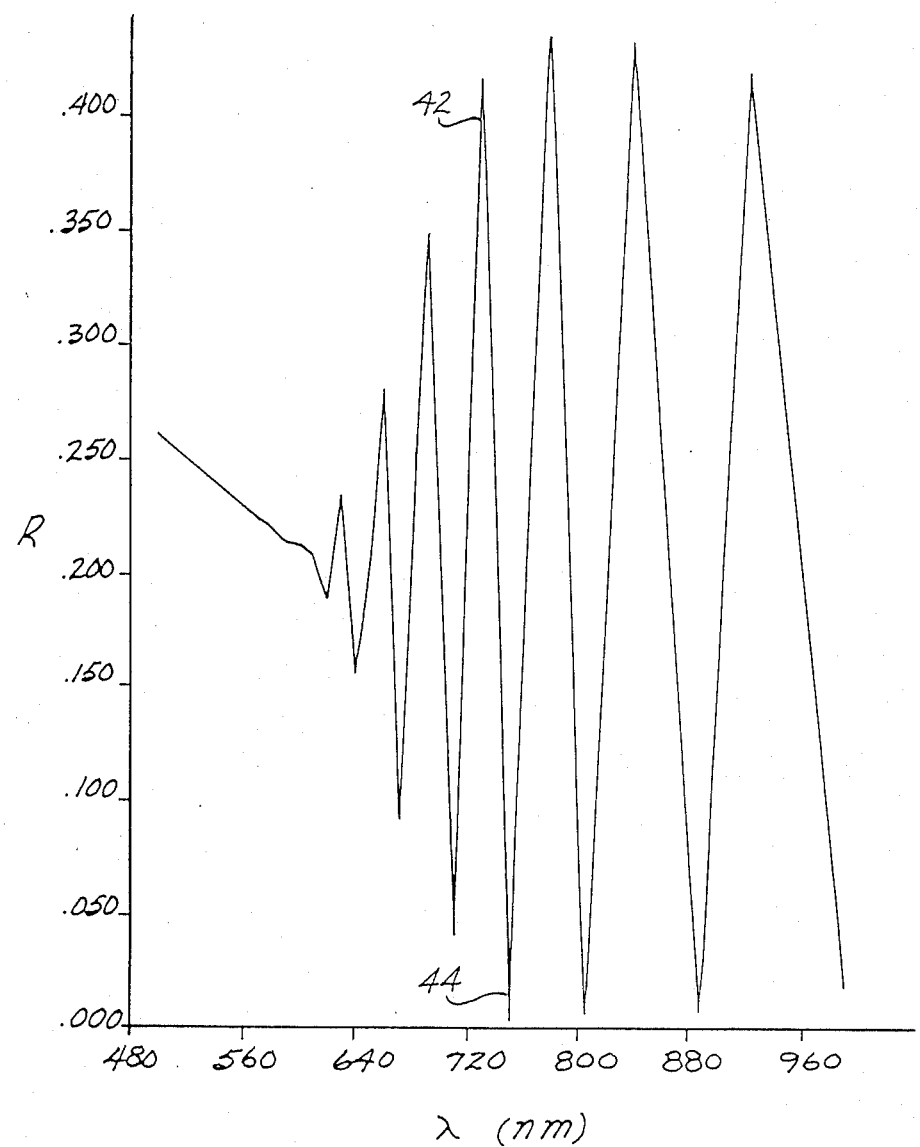
FIG. 4 is a graph showing the variation of reflectance over wavelength for a thin film of material.

In general, the reflectivity (and therefore the transmissivity) of any material is dependent upon both the index of refraction and the absorption coefficient of the material. Both of these parameters undergo a change when an electric field is applied to the material. However, in most semiconductors, at photon energies near their band gap energies, the change in the index of refraction upon application of an electric field is on the order of 100 times more effective in changing the reflectivity than is the corresponding change in the absorption coefficient. Thus, for such substances, the ER effect can be viewed as occurring because the electric field changes the index of refraction. The significance of this fact for the present invention can be appreciated by reference to FIG. 4. FIG. 4 is a graph showing the relationship between the reflectance R and wavelength $\lambda$ for a film of silicon one micron thick deposited on a borosilicate glass substrate, for an angle of incidence of about 55 degrees and polarization parallel to the plane of incidence. FIG. 4 illustrates the well-known local maxima 42 and minima 44 in reflectance that result from interference of the reflections from the front and back surfaces of the thin silicon film. Thus, FIG. 4 illustrates the same effect that is observed when viewing an oil slick on water, i.e., the thin layer of oil reflects certain colors very strongly, even though the oil and water are both transparent and colorless. It may readily be observed from FIG. 4 that the rate of change of reflectance with wavelength is very high in the range of wavelengths at which interference occurs.

Figure 5:
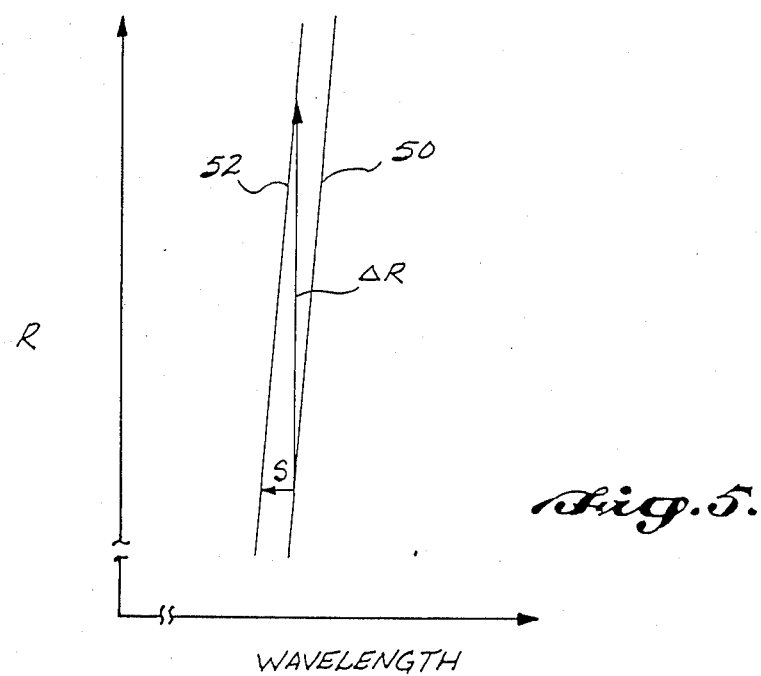
FIG. 5 is a partial graph showing the change in reflectance caused by a small change in index of refraction.

The present invention is based upon the realization that if one were to make a very small change in the optical path length of the film over some wavelength range, the result, to a good approximation, would be to shift that wavelength range of the curve of FIG. 4 a small distance horizontally along the wavelength axis. The optical path length of a film is defined to be the product of the index of refraction of the film, the thickness of the film, and the secant of the angle of propagation of light inside the film, where such angle of propagation is measured with respect to the normal to the surface of the film. We assume here that the thickness of the film and the angle of propagation of the light inside the film are constant. In this case, the optical path length is proportional to the index of refraction of the film. Referring to FIG. 5, line 50 represents a small portion of the reflectance versus wavelength graph of FIG. 4, and line 52 represents the corresponding graph that would result from a small change in the index of refraction of the silicon. The horizontal shift between the graphs is represented by arrow S. Because of the steepness of line 50, the resulting change $\Delta R$ in the reflectance is quite large for a small shift S. The reflectance change $\Delta R$ is therefore amplified by reason of the fact that the index of refraction shift occurs in a wavelength region at which interference occurs. For example, for the graph shown in FIG. 4, a change in the index of refraction of the silicon by one part in 380 will produce, at 790 nanometers, a change in reflectance R from 0.290 to 0.256, i.e., a $\Delta R$ value of 0.034. The crucial point is that the refractive index change of one part in 380 is comparable to what one would expect from applying an electric field of 50,000 volts/cm to silicon. Thus, even though a change in the index of refraction of one part in 380 would change the reflectance of a large block of silicon by about 0.29%, the same index of refraction change would produce a reflectance change of about 13% in a thin film of silicon, an amplification of the reflectivity change by a factor of 45.

Figure 6:
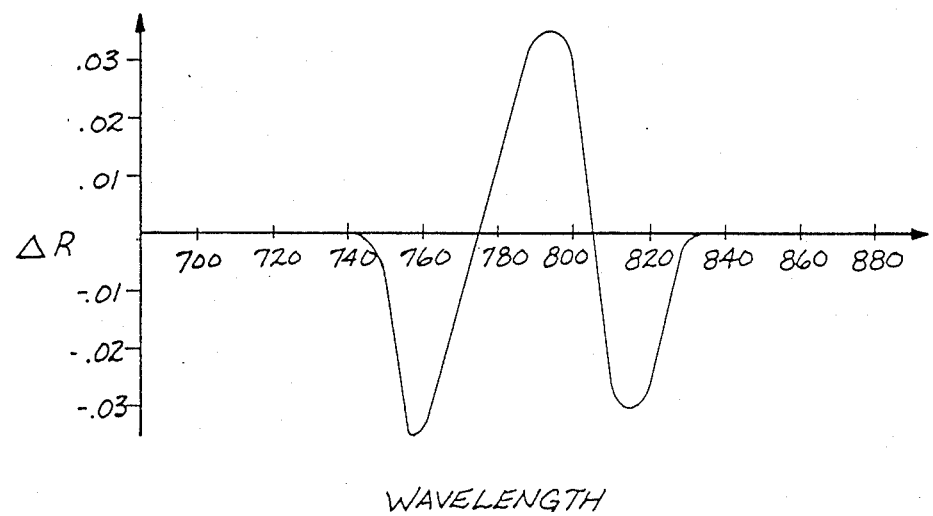
FIG. 6 is a graph showing an example of the electroreflective effect as a function of wavelength for a thin layer.

FIG. 6 continues the example of FIG. 4. In FIG. 6, it is assumed that the wavelength range from $\lambda_1$ to $\lambda_2$ (see FIG. 3) at which the silicon displays an ER effect extends from about 740 nanometers to about 830 nanometers. Assuming an electric field strength capable of changing the index of refraction of silicon by one part in 380, the resulting dependence of R on wavelength for the one micron silicon film is illustrated in FIG. 6. Thus, a comparatively large reflectance change, for a given applied electric field, can be obtained by selecting the wavelength of the illumination light to meet two criteria: (1) the wavelength must be one at which the electroreflective material exhibits the electroreflective effect, and (2) the wavelength must be selected to be one at which the reflectance of the thin layer of electroreflective material changes as the index of refraction of the layer changes.

As described below, the illumination light can be produced by a number of sources, such as semiconductor lasers, gas lasers, and LEDs. For a narrow bandwidth source such as a gas laser, the term "selected wavelength" simply refers to the wavelength at which the laser produces light. For broader bandwidth sources, such as semiconductor lasers and LEDs, "selected wavelength" refers to the wavelength at which the peak intensity of the source occurs. Although, in general, comparatively narrow bandwidth sources are preferred, there will be some applications for which the very narrow bandwidth of a gas laser will be unsuitable. This may occur, for example, when the substrate on which the layer of electroreflective material deposited is transparent to the laser light. In such a case, a very narrow bandwidth source may produce interference between the front and back surfaces of the substrate, thereby introducing a potential error into the measurement process.

Figure 7:
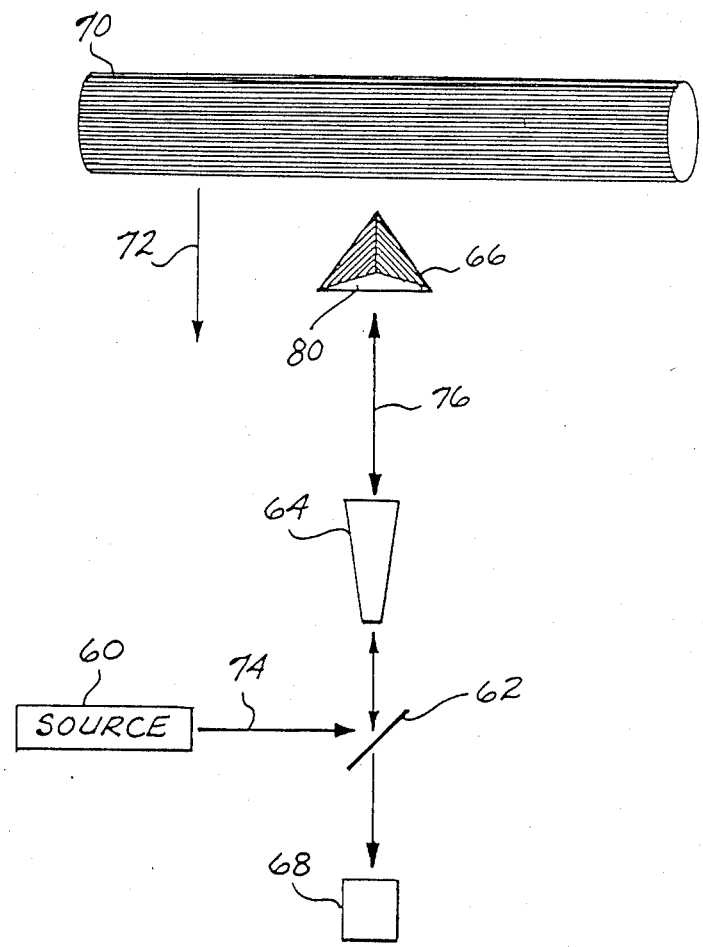
FIG. 7 is a schematic view of one preferred embodiment of the present invention.

One preferred embodiment of the apparatus of the present invention is illustrated in FIG. 7. The apparatus includes light source 60, beam splitter 62, telescope 64, corner cube reflector 66 and photodetector 68. The reflective faces of corner cube reflector 66 are coated with a thin film of an electroreflective material, and the corner cube reflector is positioned in the vicinity of high voltage AC line 70 by any suitable positioning apparatus. High voltage line 70 produces an alternating electric field that is primarily directed in a radial direction, as illustrated by electric field line 72. Source 60 generates light beam 74 at an appropriate wavelength. Beam 74 is reflected by beam splitter 62 into telescope directs the resulting collimated beam 76 to corner cube reflector 66. After reflection from the corner cube reflector, the reflected beam passes back through telescope 64 and beam splitter 62 into detector 68. For a conventional high voltage AC transmission line in the United States, the magnitude of the electric field varies at a fixed rate of 120 hertz. Detector 68 will therefore preferably comprise a synchronous detector for extracting and measuring the 120 hertz component of the signal produced by the photodetector, to thereby measure the electric field strength.

Beam 76 preferably enters corner cube reflector 66 approximately normal to triangular aperture 80 of the corner cube reflector. For such an angle of incidence, the beam will reflect off each of the three faces of the corner cube reflector at an angle of approximately 55°, the same angle assumed for the production of the graph of FIG. 4. Each reflection is affected by the ER effect, and the fact that the light reflects off three reflecting surfaces before it returns to the telescope means that the resulting effect is greater than that for a single reflection. However, polarization effects will cause the increase in the ER effect to be different from precisely a factor of 3.

Figure 8:
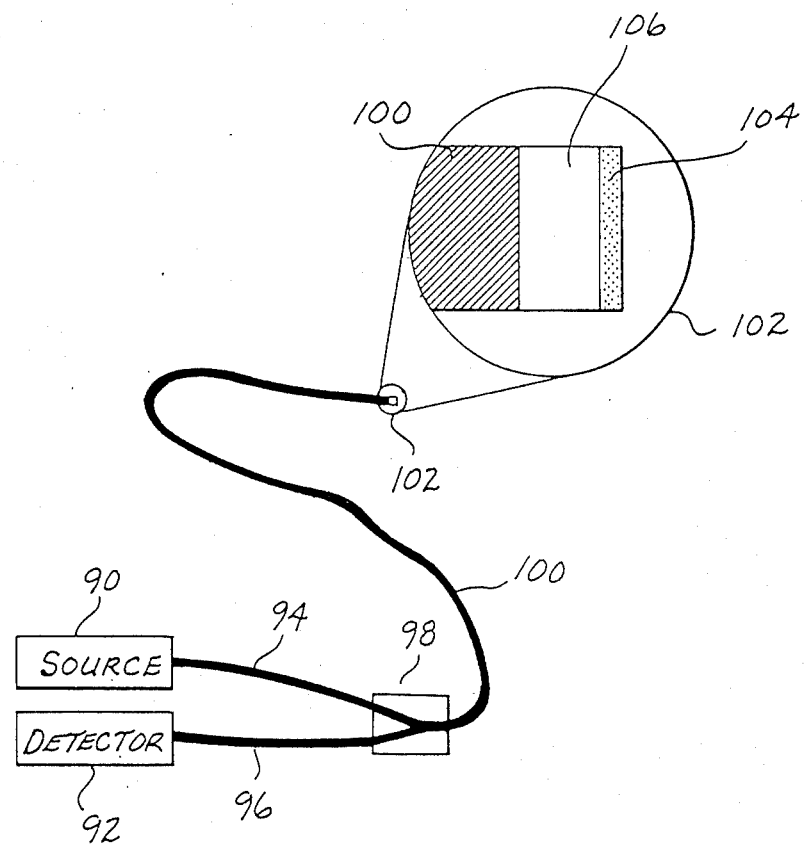
FIG. 8 is a schematic view of a second preferred embodiment of the present invention.

A second preferred embodiment of the present invention is illustrated in FIG. 8. In this embodiment, a fiber optic cable is used to convey light to and from the electroreflective material. The embodiment of FIG. 8 includes source 90, detector 92, coupler 98 and sensor 102. Source 90 produces an optical beam that passes through fiber optic cable 94 to coupler 98, and coupler 98 passes the beam on fiber optic cable 94 onto fiber optic cable 100, and thereby to sensor 102. Light reflected by sensor 102 passes back through cable 100 to coupler 98, and passes from coupler 98 through fiber optic cable 96 to detector 92. Sensor 102 is formed on the tip of fiber optic cable 100, and comprises thin layer 104 of an electroreflective material that may either be bound directly to fiber optic cable 100, or bound to an intermediate glass substrate 106 as shown in FIG. 8. In the embodiment of FIG. 8, a beam splitter could be used in place of coupler 98. Sensor 102 is placed in the region of high field strength adjacent to a high voltage line or the like, and care must therefore be taken to insure that the fiber or its jacketing does not become wet or otherwise become electrically conductive.

For all embodiments of the present invention, it is important to use an electroreflective material that can be deposited on a substrate such as glass, and still retain its ER sensitivity. Recent research has shown that a non-crystalline form of silicon called hydrogenated amorphous silicon can be deposited by glow discharge or other chemical vapor deposition techniques on glass, and will exhibit the ER effect at wavelengths between 700 and 800 nanometers. This wavelength range is ideal if one wishes to use semiconductor light sources such as laser diodes or light emitting diodes. The glow discharge or other chemical vapor deposition techniques are satisfactory methods for fabricating an ER layer on the three reflecting surfaces of a corner cube reflector, or on a glass substrate for positioning at the tip of a fiber optic cable. For the embodiment of FIG. 8, an alternative technique can be used in which a wafer of crystalline silicon is bonded to a wafer of glass by electrostatic bonding. The silicon is then ground and etched to the desired thickness. However, the ER effect in crystalline silicon occurs at a wavelength of 1060 nanometers. This is a potential disadvantage, because there are presently no commercially available semiconductor laser sources at this wavelength. However, the neodymium-YAG laser operates at this wavelength, and would make a suitable though costly optical source.

Figure 9:
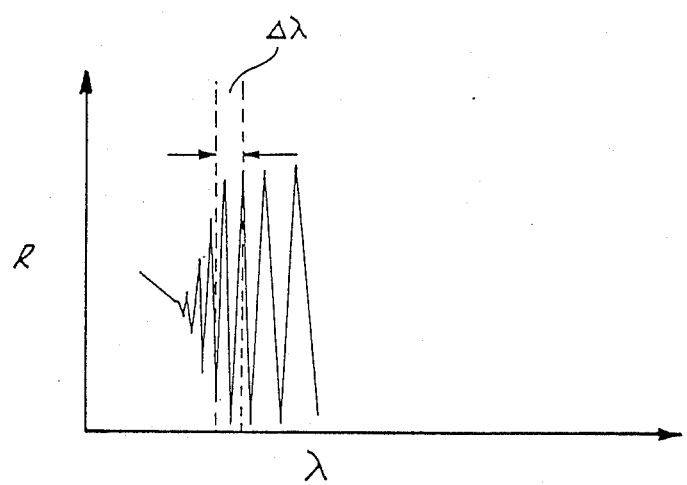
FIG. 9 is a graph showing the variation of reflectance with wavelength for a comparatively thick layer.
Figure 10:
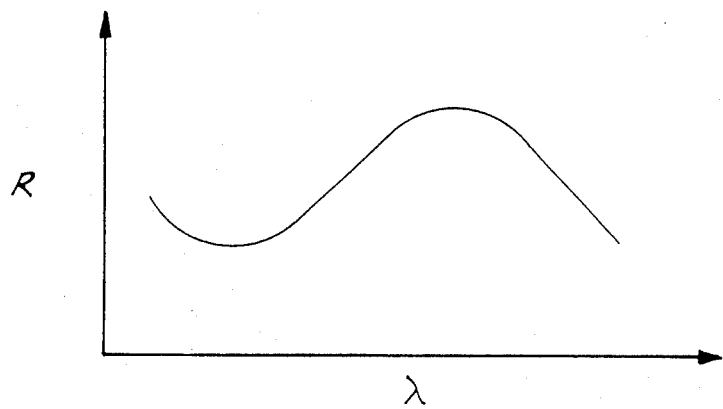
FIG. 10 is a graph showing the variation of reflectance with the wavelength for a very thin layer.

FIGS. 9 and 10 illustrate considerations that should be taken into effect in selecting the thickness of the thin layer of electroreflective material. As is well known, as the thickness of a layer increases and becomes large in comparison to the wavelength of the illuminating radiation, the resulting interference peaks move closer together, as schematically illustrated in FIG. 9. This can result in an increasing sensitivity of the reflectance of the layer to small changes in refractive index. Eventually, however, the distance in wavelength between adjacent peaks in the reflectivity versus wavelength graph becomes comparable to the bandwidth $\alpha\lambda$ of the illumination source. When this occurs, a small shift in the reflectance versus wavelength graph caused by an index of refraction change produces little if any overall reflectance change, because of the averaging effect resulting from the finite bandwidth. A second consideration limiting the thickness of the layer of electroreflective material is that the attenuation of light in the material must be low enough to permit reflections from the two surfaces of the layer to interfere.

When the layer of electroreflective material becomes too thin, the interfreence peaks spread out, and as a result the rate of change of reflectance versus wavelength decreases, as illustrated in FIG. 10. When this occurs, the reflectance change produced by a given index of refraction change also decreases, leading to a decrease of the amplification factor. Eventually a point will be reached at which the amplification factor is too small to produce an accurate or useful measurement of the electric field. These considerations lead to the conclusion that for presently available materials, a preferred range for the thickness of the electroreflective layer is from 0.2–5 microns, and preferred wavelengths for the illumination signal are in the range of 200-2000 nanometers.

It is clear that any physical effect that changes the optical path length of the ER film will also cause a change in the reflectance of the film. One such physical effect is a change in the optical path length of the ER film caused by a change in the temperature of the film. Another physical effect that can cause a change in the optical path length is a change in the angle of propagation of the light inside the film. This would result, for example, from a rotation of the corner cube reflector with respect to the direction of propagation of the incident light beam, or from using a substantially uncollimated beam. For some applications, it may be important to separate the reflectivity change resulting from the ER effect from reflectivity changes resulting from changes in the temperature or the angle of the propagation of the light.

One method of separating reflectivity changes caused by the ER effect from other reflectivity changes has already been described, and involves synchronous demodulation of the photodetector signal to select only the frequency at which the electric field is known to be varying. A second method of separating the ER effect from other effects is based upon the fact that the ER effect occurs over limited wavelength ranges, such as shown by the wavelength range $\lambda_1$ to $\lambda_2$ in FIG. 3. On the other hand, physical effects such as a temperature effect or an angle effect, for example, generally cause changes in the optical path length of the ER material over much wider wavelength ranges and, in many cases, at every wavelength. Thus, one could monitor the temperature or angle effects on the ER film using a light beam at a wavelength outside of range $\lambda_1$ to $\lambda_2$ in the same manner and at the same time one monitors the ER effect as described above.

The use of an interference effect to measure temperature or angle is well known in the art, as is the use of multiple wavelengths to make simultaneous reflectivity measurements. The possibility of simultaneously making a measurement of electric field and one other measurement using one device is made especially attractive because of the limited range of wavelengths over which typical materials are sensitive to the ER effect. Thus, a measurement of reflectivity outside the wavelength range $\lambda_1$ to $\lambda_2$ can be used to calibrate the optical path length of the ER film in the absence of an ER effect, but including the combined effects of temperature and angle, and a simultaneous measurement of reflectivity within wavelength range $\lambda_1$ to $\lambda_2$ can be used to measure the optical path length of the ER film including the combined effects of electric field, temperature, and angle. By suitably analyzing these two simultaneous measurements, the effect of electric field on the ER film can be ascertained even as temperature and angle vary. Thus, the measurement of electric field strength may be made independent of other effects.

While the preferred embodiments of the invention have been illustrated and described, it is to be understood that variations will occur to those skilled in the art. Accordingly, the invention is not to be limited to the specific embodiments disclosed and the true scope and spirit of the invention are to be determined by reference to the following claims.

The embodiments of the invention in which an exclusive property or privilege is claimed are defined as follows:

1. A device for measuring an electric field at a point, comprising:
   a probe positionable at said point, the probe comprising a layer of an electroreflective material, said layer including first and second surfaces and having a substantially uniform thickness along a direction normal to said surfaces; and
   sensor means including source means for generating an optical source signal at a selected wavelength, means for directing the source signal onto the probe such that the first and second surfaces produce an optical output signal, and detector means for determining the intensity of the output signal, the selected wavelength being selected such that the electroreflective material exhibits the electroreflective effect at the selected wavelength, and such that the reflectance of said layer of electroreflective material at the selected wavelength changes as the index of refraction of the electroreflective material changes.

2. The device of claim 1, wherein the source signal has a predetermined bandwidth, and wherein the thickness of said layer is selected such that a graph of the reflectance of the layer as a function of wavelength includes a local maximum and a local minimum, in the region adjacent the selected wavelength, that are spaced from one another by a wavelength difference no less than said bandwidth.

3. The device of claim 1, wherein the thickness of said layer is in the range 0.2 microns through 5 microns.

4. The device of claim 3, wherein the selected wavelength is in the range 200–2000 nanometers.

5. The device of claim 1, wherein the electroreflective material comprises hydrogenated amorphous silicon.

6. The device of claim 1, wherein the sensor means includes fiber optic means having first and second ends, the probe being positioned adjacent the second end to receive the source signal from the fiber optic means and return the output signal to the fiber optic means, the source means being adapted to couple the source signal into the first end of the fiber optic means, and the detector means being adapted to receive the output signal from the first end of the fiber optic means.

7. The device of claim 1, wherein the output signal comprises a reflected signal formed by reflection of the source signal at the first and second surfaces.

8. The device of claim 7, wherein the source signal has a predetermined bandwidth, and wherein the thickness of said layer is selected such that a graph of the reflectivity of the layer as a function of wavelength includes a local maximum and a local minimum, in the region adjacent the selected wavelength, that are spaced from one another by a wavelength difference no less than said bandwidth.

9. The device of claim 7, wherein the thickness of said layer is in the range 0.2 microns through 5 microns.

10. The device of claim 9, wherein the selected wavelength is in the range 200–2000 nanometers.

11. The device of claim 7, wherein the electroreflective material comprises hydrogenated amorphous silicon.

12. The device of claim 7, wherein the sensor means includes fiber optic means having first and second ends, the probe being positioned adjacent the second end to receive the source signal from the fiber optic means and return the output signal to the fiber optic means, the source means being adapted to couple the source signal into the first end of the fiber optic means, and the detector means being adapted to receive the output signal from the first end of the fiber optic means.

13. The device of claim 7, wherein said probe comprises a corner cube reflector having three planar faces oriented normally with respect to one another, said layer of electroreflective material being deposited on at least one of said faces.

14. The device of claim 13, wherein the sensor means includes a telescope and beam control means for directing a portion of the source signal through the telescope to the probe and for directing a portion of the reflected signal to the detection means.

15. The device of claim 1, wherein the output signal comprises a transmitted signal formed by transmission of the source signal at the first and second surfaces.

16. A method of measuring an electric field at a point, comprising:
    positioning a probe at said point, the probe comprising a layer of an electroreflective material, said layer including first and second surfaces and having a substantially uniform thickness along a direction normal to said surfaces;
    generating an optical source signal at a selected wavelength;
    directing the source signal onto the probe such that the first and second surfaces produce an optical output signal; and
    determining the intensity of the output signal, the selected wavelength being selected such that the electroreflective material exhibits the electroreflective effect at the selected wavelength, and such that the reflectance of said layer of electroreflective material at the selected wavelength changes as the index of refraction of the electroreflective material changes.

17. The method of claim 16, wherein the selected wavelength is in the range 200-2000 nanometers.

18. The method of claim 16, wherein the source signal is directed onto the probe by means of a fiber optic cable.

19. The method of claim 16, wherein the output signal comprises a reflected signal formed by reflection of the source signal at the first and second surfaces.

20. The method of claim 19, wherein the probe comprises a corner cube reflector having three planar faces oriented normally with respect to one another, said layer of electroreflective material being deposited on at least one of said faces, and wherein the source signal is directed onto the probe by means of a telescope.

21. The method of claim 16, wherein the output signal comprises a transmitted signal formed by transmission of the source signal at the first and second surfaces.

* * * * *